United States Patent [19]
Yuen et al.

[11] Patent Number: 5,991,326
[45] Date of Patent: Nov. 23, 1999

[54] LATTICE-RELAXED VERTICLE OPTICAL CAVITIES

[75] Inventors: Wupen Yuen, Stanford; Gabriel S. Li, Daly City; Constance J. Chang-Hasnian, Union City, all of Calif.

[73] Assignee: Bandwidth9, Inc., Fremont, Calif.

[21] Appl. No.: 09/060,227

[22] Filed: Apr. 14, 1998

[51] Int. Cl.$^6$ ............... H01S 3/08; H01S 3/085
[52] U.S. Cl. ............... 372/96; 372/45; 372/46; 372/99; 438/38; 438/44; 438/29
[58] Field of Search ............... 372/45, 46, 96, 372/99; 438/38, 44, 29

[56] References Cited

U.S. PATENT DOCUMENTS

| | | | |
|---|---|---|---|
| 5,018,157 | 5/1991 | Deppe et al. | 372/45 |
| 5,493,577 | 2/1996 | Choquette et al. | 372/46 |
| 5,805,624 | 9/1998 | Yang et al. | 372/45 |
| 5,903,586 | 5/1999 | Ramdani et al. | 372/45 |

Primary Examiner—Rodney Bovernick
Assistant Examiner—Sung T. Kim
Attorney, Agent, or Firm—Wilson Sonsini Goodrich & Rosati

[57] ABSTRACT

A monolithic long-wavelength vertical optical cavity device built up along a vertical direction. The device, when designed as a surface emitting laser, has a bottom Distributed Bragg Reflector (DBR), an active region consisting of active bulk medium or quantum wells, a current confinement layer next to the active layer, and a top DBR. The bottom DBR and the active region are lattice matched to the lattice defining material, while the top DBR is lattice relaxed. The design achieves high reflectivity, low absorption and diffraction loss. The design also ensures low production cost due to low precision requirement and wafer size production. The device can be used as a light detector when the active region is replaced by a spacer or a optical filter.

23 Claims, 5 Drawing Sheets

– 5,991,326 –

LATTICE-RELAXED VERTICLE OPTICAL CAVITIES

FIELD OF THE INVENTION

This invention relates generally to vertical optical cavity structures such as vertical cavity surface emitting lasers (VCSELs) and detectors (VCDETs) grown under lattice-relaxed conditions, and especially structures in which one of the Distributed Bragg Reflectors (DBRs) is grown under lattice-relaxed conditions.

BACKGROUND

Continued advances in long-distance, fiber-optic communications depend on high-quality laser sources. Since optical fibers exhibit lowest attenuation and dispersion at the wavelengths of 1.3 $\mu$m and 1.55 $\mu$m suitable sources should emit at these relatively long wavelengths in single-mode operation.

Traditionally, long-wavelength distributed feedback (DFB) lasers are employed in fiber-optic communications systems for their single longitudinal and transverse mode characteristics. However, fabricating DFB lasers involves very complicated and low-yield processes. Furthermore, the DFB laser performance is very sensitive to the surrounding temperature change. Thus, complicated electronics are needed in the transmitter to control the operating environment. These disadvantages render the DFB laser a very expensive light source and severely limit its application in the fiber-optic communications field.

Vertical Cavity Surface Emitting Lasers (VCSELs) emitting in the 1.3 $\mu$m and 1.55 $\mu$m ranges have been visualized as promising candidates for replacing DFBs in telecommunications applications. Due to their extremely short cavity length (on the order of one lasing wavelength), VCSELs are intrinsically single longitudinal mode devices. This eliminates the need for complicated processing steps that are required for fabricating DFB lasers. Furthermore, VCSELs have the advantage of wafer-scale fabrication and testing due to their surface-normal topology.

Unfortunately, VCSELs suffer material limitations that are negligible in the case of short-wavelength VCSELs but drastically affect the performance of long-wavelength VCSELs. The small available refractive index difference $\Delta n$ between reflective layers of the Distributed Bragg Reflectors (DBRs) requires that a large number of layers with high composition and thickness precision be used to achieve sufficient reflectivity. Also, the small $\Delta n$ results in high diffraction losses. Furthermore, high free-carrier absorption loss limits the maximum achievable reflectivity and the high non-radiative recombination rate increases the electrical current for reaching the lasing threshold.

These problems have restricted prior art fabrication efforts to non-wafer-scale, complicated and low-yield processes such as wafer fusion described by D. I. Babic et al., "Room-Temperature Continuous-Wave Operation of 1.54 $\mu$m Vertical-Cavity-Lasers", IEEE Photonics Technology Letters, Vol. 7, No. 11, 1995, pp. 1225–1227 and Y. Ohiso et al., "1.55 $\mu$m Vertical-Cavity Surface-Emitting Lasers with Wafer-Fused InGaAsP/InP—GaAs/AlAs DBRs", Electronics Letters, Vol. 32, No. 16, 1996, pp. 1483–1484. Alternatively, long-wavelength VCSELs have also been manufactured by dielectric evaporation as described by S. Uchiyama et al., "Low Threshold Room Temperature Continuous Wave Operation of 1.3 $\mu$m GaInAsP/InP Strained Layer Multiquantum Well Surface Emitting Laser", Electronics Letters, Vol. 32, No. 11, 1996, pp. 1011–13; M. A. Fisher et al., "Pulsed Electrical Operation of 1.5 $\mu$m Vertical-Cavity-Surface-Emitting Lasers", IEEE Photonics Technology Letters, Vol. 7, No. 6, 1995, pp. 608–610 and T. Tadokoro et al., "Room Temperature Pulsed Operation of 1.5 $\mu$m GaInAsP/InP Vertical-Cavity Surface-Emitting Lasers", IEEE Photonics Technology Letters, Vol. 4, No. 5, 1992, pp. 409–411. Unfortunately, these methods do not allow one to efficiently grow long-wavelength VCSELs.

The prior art also addresses the problems associated with free-carrier absorption and non-radiative recombination which affect the threshold current. For example, in U.S. Pat. No. 5,034,958 Kwon et al. states that current confinement in VCSELs is necessary to improve current efficiency. Kwon also teaches that a high $\Delta n$ material should be used for top and bottom DBRs. In U.S. Pat. No. 5,493,577 Choquette et al. further expand on the current confinement issue and teaches oxidation of the material layers of the VCSEL for this purpose. Still more information on this issue is found in U.S. Pat. No. 5,719,891 to Jewell.

Unfortunately, none of the prior art structures combines improved electrical properties with high DBR reflectivity. Moreover, the fabrication processes are difficult and preclude one-step methods.

Some recent attempts focus on reducing the number of DBR layers while preserving high reflectivity by growing the DBRs on a suitable substrate such as InP. For example, 0. Blum et al. teach the growth of AlAsSb/GaAsSb and AlAsSb/AlGaAsSb DBRs on InP in "Electrical and Optical Characteristics of AlAsSb/GaAsSb Distributed Bragg Reflectors for Surface Emitting Lasers", Applied Physics Letters, Vol. 67, Nov. 27, 1995, pp. 3233–35 and in "Digital Alloy AlAsSb/AlGaAsSb Distributed Bragg Reflectors Lattice Matched to InP for 1.3–1.55 $\mu$m Wavelength Range", Electronics Letters, Vol. 31, No. 15, 1995, pp. 1247–8. Additional background information is also presented by T. Anan et al., "Improved Reflectivity of AlPSb/GaPSb Bragg Reflector for 1.55 $\mu$m Wavelength", Electronics Letters, Vol. 30, No. 25, 1994, pp. 2138–9; B. Lambert et al., "High Reflectivity 1.55 $\mu$m (Al)GaAsSb/AlAsSb Bragg Reflector Lattice Matched on InP Substrates", Applied Physics Letters, Vol. 66, No. 4, 1995, pp. 442–3 and L. Goldstein et al., "Metamorphic GaAs/AlAs Bragg Mirrors Deposited on InP for 1.3/1.55 $\mu$gm Vertical Cavity Lasers", LEOS Summer Topical Meetings, pp. 49–50, Montreal, Quebec, Canada, 1997.

Thus, although preferable characteristics required of a 1.3/1.55 $\mu$m VCSEL for fiber-optic communications have been identified, there are no prior art techniques for combining them together in one, easy-to-fabricate device.

OBJECTS AND ADVANTAGES

It is therefore a primary object of the present invention to provide a vertical cavity structure which combines the characteristics required for applications in the field of fiberoptic communications. Specifically, the device of the invention should be designed for efficient operation in the range from 1.3 $\mu$m to 1.55 $\mu$m. Moreover, the structure can be an active laser, i.e., a Vertical Cavity Surface Emitting Laser (VCSEL), or a Vertical Cavity Detector (VCDET).

It is another object of the invention to ensure that the structure is easy-to-fabricate, and in particular admits of being grown in one processing step.

Yet another object of the invention is to provide a method for growing vertical cavity structures exhibiting these advantageous characteristics.

Further objects and advantages will become apparent upon reading the specification.

SUMMARY

These objects and advantages are attained by a vertical optical cavity which has a lattice-matched portion and a lattice-relaxed portion. The lattice-matched portion is grown to match a lattice of a lattice defining material, most preferably InP. This portion can include a bottom Distributed Bragg Reflector (DBR) and an active region grown on top of the bottom DBR. The lattice-relaxed portion has a predetermined lattice mismatch factor and includes a top DBR which is grown on top of the active region.

When the vertical optical cavity is to operate as a Vertical Cavity Surface Emitting Laser (VCSEL) the active region consists bulk active media, or a Quantum Well region with at least one Quantum Well. Any of the commonly known types of Quantum Wells can be incorporated into the vertical cavity structure of the invention. For example, the Quantum Well can be a compressive strained Quantum Well, a tensile strained Quantum Well or an unstrained Quantum Well. Similarly, the Quantum Well barriers can be unstrained or strained. Alternatively, if the vertical optical cavity is to operate as a Vertical Cavity Detector (VCDET) the active region contains at least one filter layer.

The lattice mismatch factor in the lattice-relaxed portion can be as large as 20%. The bottom DBR is made of a material selected from among InAlGaAs, InGaAsP, AlGaAsSb. Meanwhile, the top DBR can be made of a material selected from among AlGaAs, InGaP and InGaAsP.

In a preferred embodiment the vertical optical cavity has an intermediate layer adjacent the active layer such as a current-confining layer. The intermediate layer can be lattice-matched to InP. The top DBR can be partially oxidized to achieve higher reflectivity.

In another embodiment the vertical cavity has a tunable air gap adjacent the active layer. In this case the top portion can be suspended on a cantilever structure and thus the air gap permits one to tune the resonant wavelength of the vertical cavity. The method of the invention allows one to grow a vertical optical cavity by an epitaxial growth method, such as Molecular Beam Epitaxy (MBE), in one step. In some cases the epitaxy technique for growing the lattice-relaxed portion of the cavity can differ from the technique used for growing the lattice-matched portion. Current confinement is achieved by controlled oxidation or ion implantation of appropriate layers of the cavity.

A detailed explanation of the invention is contained in the detailed specification with reference to the appended drawing figures.

DETAILED DESCRIPTION

The structure of a Vertical Cavity Surface Emitting Laser (VCSEL) 1 of the present invention is a layered structure in which light is emitted in a vertical direction that is perpendicular to the planes of the layers.

Figure 1:
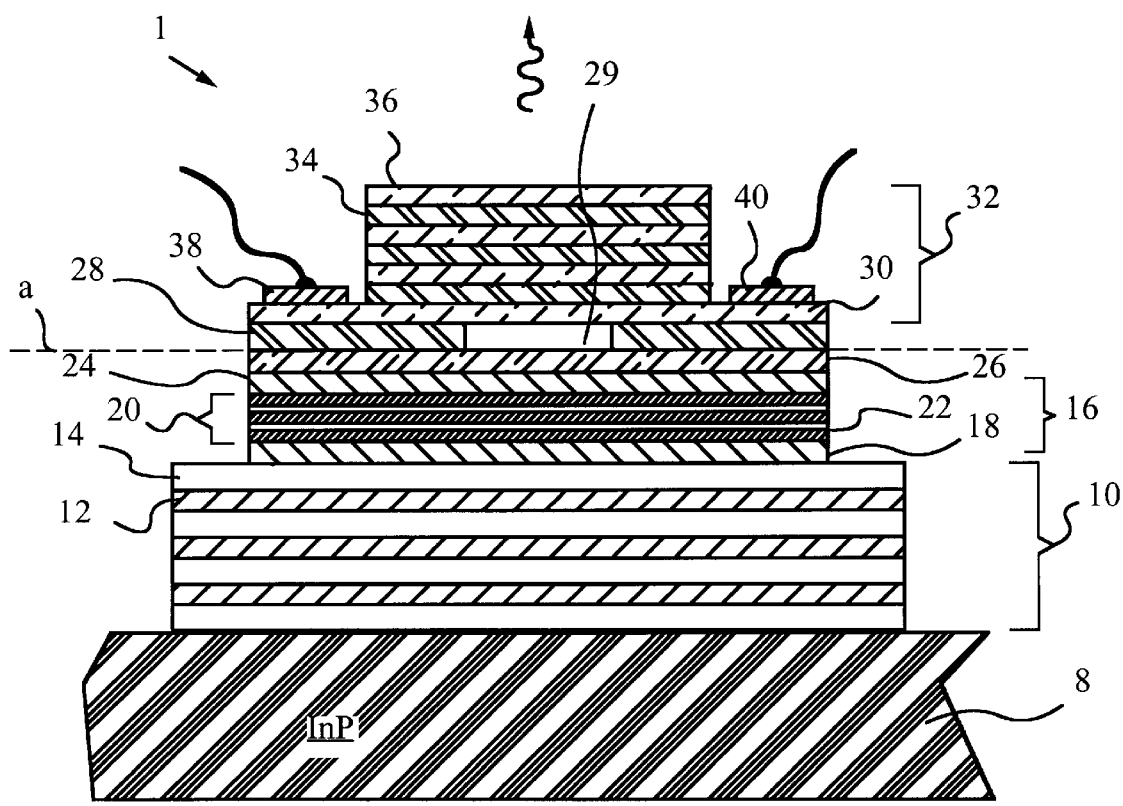
FIG. 1 is a cross sectional side view illustrating a VCSEL made according to the invention.

In the preferred embodiment of the invention shown in FIG. 1, the base material is a lattice defining material 8 preferably consisting of InP.

A stack of layers 10 on top of base material InP 8 consists of a material selected from the group consisting of InAlGaAs, InGaAsP, and AlGaAsSb. This portion of VCSEL 1 is also referred to as the bottom Distributed Bragg Reflector (DBR) 10. This stack is composed of alternating layers 12 and 14, of InAlGaAs and InAlAs in the present embodiment. The refractive index is slightly different between layers 12 and 14. The number of the alternating layers is often from 15–20 in order to achieve the desired reflectivity. Desired reflectivity dictate how many pairs of layers 12 and 14 are required.

Bottom DBR 10 is lattice matched to the lattice defining material. Bottom DBR 10 can be grown using any epitaxial growth method, such as Metal-Organic Chemical Vapor Deposition (MOCVD) or Molecular Beam Epitaxy (MBE).

A spacer layer 18 is deposited on top of bottom DBR 10. The material of spacer layer 18 is preferably InGaAsP or InAlGaAs. Spacer layer 18 is lattice matched to the lattice defining material.

The stack on top of spacer layer 18, as shown, includes a number of quantum wells 22 which make up a quantum well region 20. Quantum wells 22 are the active medium of VCSEL 1. Quantum well region 20 can have the following variations: Quantum well region 20 may consist of a single quantum well or multiple quantum wells. Region 20 can also be replaced by a bulk active medium. A material of a quantum well layer can be selected from among unstrained well materials, compressive strained materials and tensile strained materials. The barriers of quantum wells 22 can be unstrained, or can have strain that is opposite to the well strain. The sum of the strain-thickness product of the wells and that of all barriers, including signs, can be zero or close to zero. Selection of the active materials is dictated by the wavelength requirement of the VCSEL 1, as understood by a person of average skill in the art.

Another spacer layer 24 is grown on top of quantum well region 20. Spacers 24 and 18 are of same material, and are lattice matched to lattice defining material 8.

Two spacers 18 and 24 and quantum well region 20 constitute an active region 16. The total optical thickness of the active region 16, confinement layer 28 and intermediate layer 26 can be integer multiple of the half cavity wavelength.

Active region 16 and bottom DBR 10 are the lattice matched portion of VCSEL 1. The lattice constant is that of InP, or 5.8688 angstroms in the preferred embodiment.

At least one additional intermediate layer 26 is deposited on top of spacer layer 24. This layer is composed of lattice matched materials, such as InAlGaAs, InGaAsP, AlGaAsSb. Intermediate layer 26 is applied to prevent a lattice mismatched top DBR 32 from affecting the lattice structure of quantum well region 20. Intermediate layer 26 is not needed when spacer 24 is sufficiently thick. For an example, when spacer 24 is 1,800 angstroms, a intermediate layer 26 of 5,000 angstrom is needed. When spacer 24 is 3,000 angstroms, then intermediate layer 26 is not needed. A person of average skill in the art will be able to determine the critical thickness of spacer 24 up to which intermediate layer 26 is necessary without undue experimentation.

A layer 28 on top of spacer layer 26 is defined as the current confinement layer. This layer is composed of AlGaAs with high Al-content. Oxidation of layer 26 forms an isolating peripheral ring around a center aperture 29. The size of aperture 29 is controlled by adjusting the oxidation time. The oxidation process is obvious to a person of average skill in the art. Aperture 29 serves as the electrical current pathway to provide electrical pumping to VCSEL 1. Furthermore, aperture 29 ensures uniform and efficient current injection. Besides current confinement, aperture 29 also provides strong index guiding to the optical mode of VCSEL 1. The implementation of confinement layer 28 will lower the threshold current and enhance the output power due to reduced diffraction loss from the cavity. Excellent electrical and optical confinement provided by the confinement layer 28 drastically improves the performance of VCSEL 1.

A top DBR 32 is grown on top of confinement layer 28. Confinement layer 28 can also be considered as part of top DBR 32. Bottom DBR 10 and top DBR 32 constitute the resonant cavity of VCSEL 1. Confinement layer 28 and top DBR 32 are the lattice relaxed portion of VCSEL 1. The lattice mismatch factor is predetermined and is normally up to 20% from the lattice defining material 8.

Top DBR 32 is made of a material selected from among AlGaAs, InGaP and InGaAsP. In the preferred embodiment, it is composed of a set of alternating layers, 36 and 34, of AlGaAs and the high Al-content AlGaAs. High Al-content AlGaAs layers 34 are the low refractive index layers.

Top DBR 32 can be partially oxidized. Oxidation of top DBR 32 is optional. The purpose of oxidizing top DBR 32 is to create a large refractive index difference between adjacent layers. This index difference can drastically increase the DBR stop bandwidth, and therefore relax the growth accuracy for top DBR 32. The high-contrast, oxidized DBR 32 reduces the diffraction loss and eliminates the free-carrier-absorption loss.

In the case where oxidized top DBR 32 is used, the thickness of high Al-content layers 36 and 34 is calculated by taking into account the refractive index and thickness change resulted from the oxidation process. The oxidized part of top DBR 32 is undoped to eliminate free-carrier absorption loss. The oxidation of the top DBR 32 can be done in conjunction with the oxidation of confinement layer 28. The oxidation process is conducted in a water-saturated nitrogen ambient, at a temperature between 350° C. to 450° C.

Bottom DBR 10, and active region 16 and top DBR 32 can be grown in the same epitaxial process. This procedure allows full-wafer growth and processing, and therefore significantly reduces the cost of fabricating long-wavelength VCSELs. Lattice relaxed portion of VCSEL 1 can also be grown by a separate epitaxial growth process. Preferably, the growth temperature for top DBR 32 is under 500° C.

FIG. 1 also shows two standard p-contacts, 38 and 40, at the bottom of top DBR 32. P-contacts 38 and 40 are evaporated or plated according to well-known technology to provide the electrical current for VCSEL 1.

VCSEL 1 can be either top-emitting or bottom-emitting. It is obvious to a person of average skill in the art to modify the design of the device accordingly by altering the reflectivity of top DBR 32 and bottom DBR 10.

Figure 2:
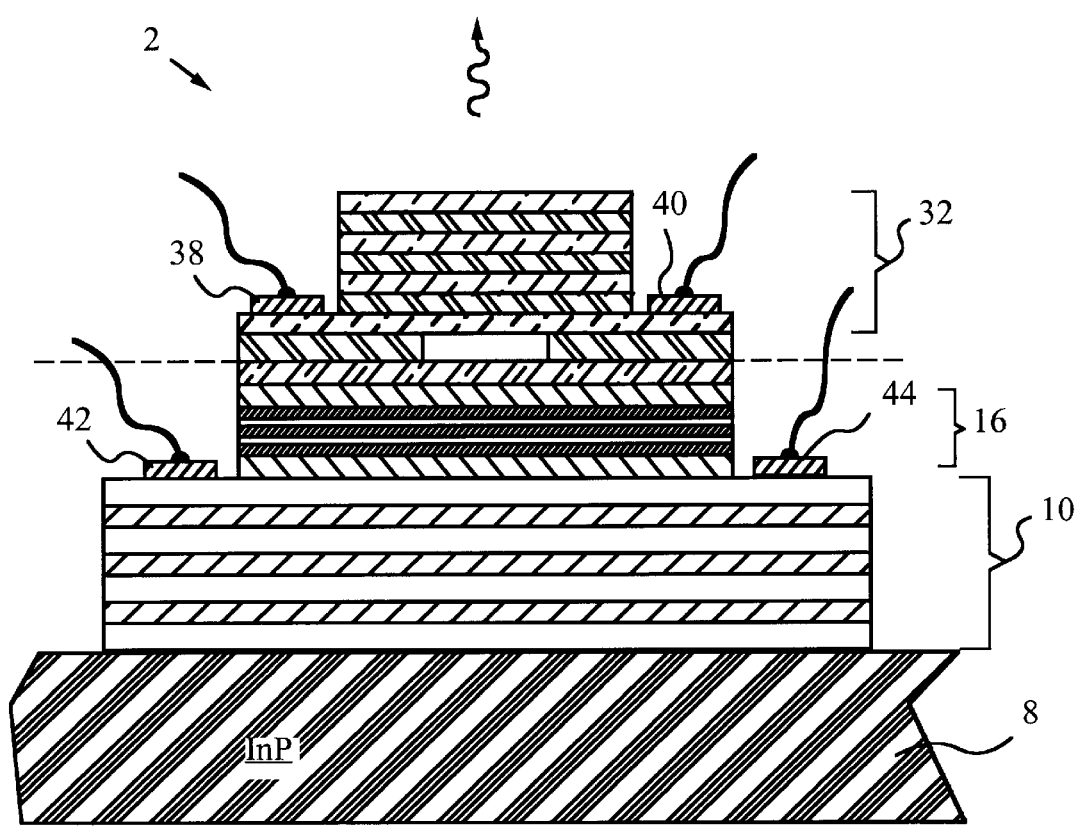
FIG. 2 is a cross sectional view of an embodiment of a VCSEL designed to reduce free carrier loss.

FIG. 2 shows a variation of VCSEL 1 shown in FIG. 1. Two n-contacts, 42 and 44, are attached to bottom DBR 10. P-contacts, 38 and 40, and n-contacts, 42 and 44, attached to a VCSEL 2 can remove free-carrier absorption from the device. Attachment method of such contacts 38, 40, 42, and 44 is obvious to a person of average skill in the art. VCSEL 2 can also be either top-emitting or bottom-emitting.

Figure 3:
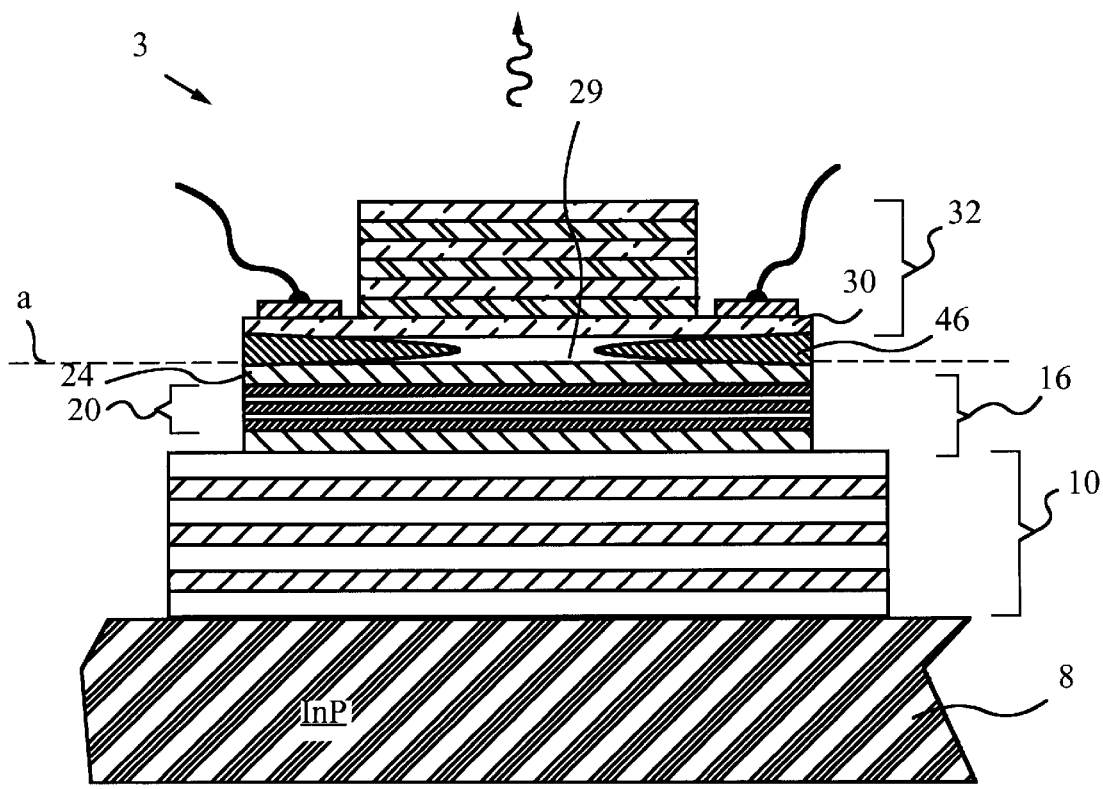
FIG. 3 is a cross sectional view of an embodiment of a VCSEL using ion implantation for current confinement.

FIG. 3 shows another variation of a VCSEL 1. To make a VCSEL 3, the ion-implantation method, instead of the oxidation method, is applied to create a current aperture 29 in the confinement layer 28 above active region 16. A region 46 in FIG. 3 shows the ion-implanted region in the confinement layer 28. The implantation energy is properly chosen so that the implanted ions effectively confine the current without damaging active region 16. The species of the ion are chosen such that optimal current, least damage and least diffusion of the implanted ions are resulted. In this configuration, the confinement layer can be lattice matched to the lattice defining material, and intermediate layer 26 described in FIG. 1 is not needed. Top DBR 32 can also be partially ionized during the ionization of confinement layer 28. VCSEL 3 can also be either top-emitting or bottom-emitting. VCSEL 3 can also incorporate the intracavity configuration applied in VCSEL 2 by adding two electrical n-type contacts on bottom DBR 10.

Figure 4:
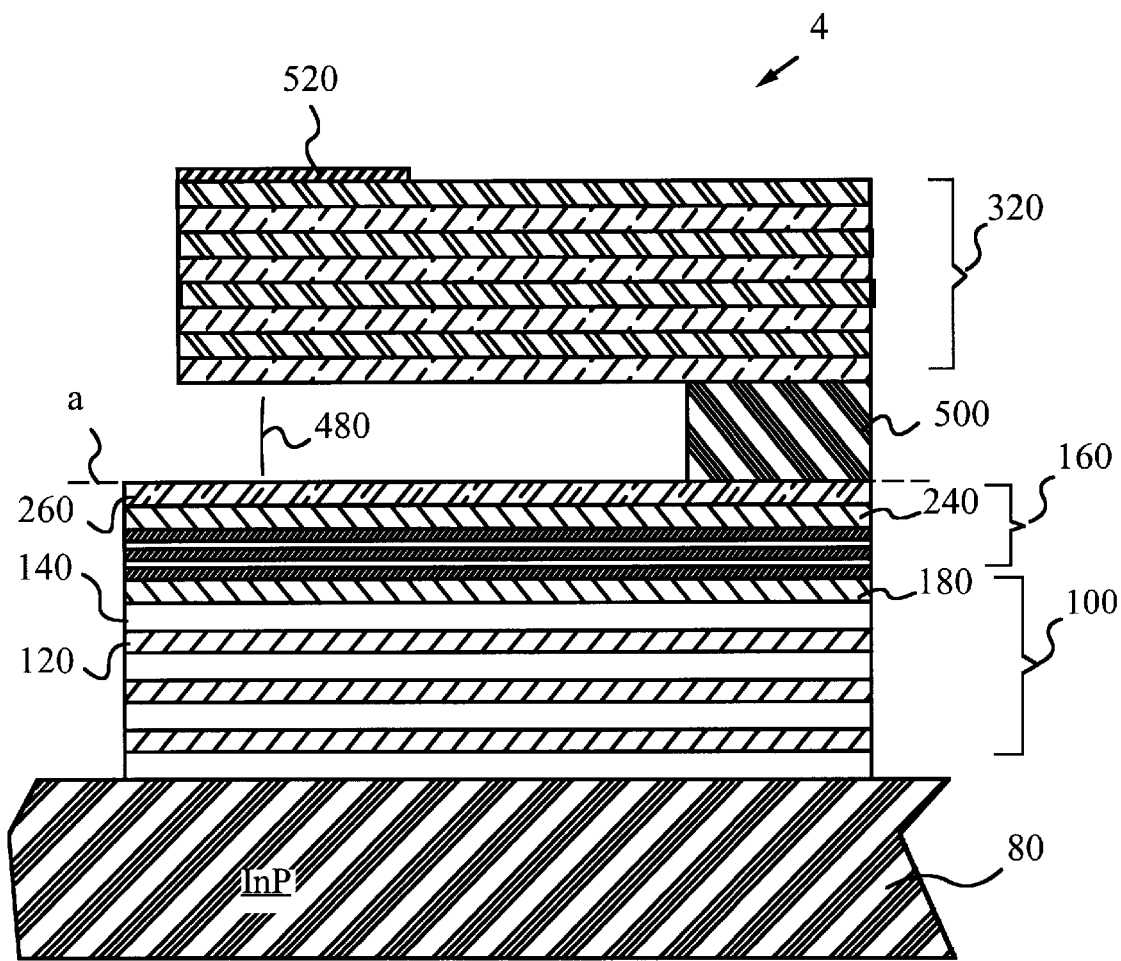
FIG. 4 is a cross sectional view of a VCSEL with a tunable air gap according to the invention.

FIG. 4 is a cross sectional view of a vertical cavity 4 with a tunable air gap 480. This structure can be used as a VCSEL or a vertical cavity detector (VCDET).

The following components of VCSEL 4 are similar in material composition and specifications to respective components of VCSEL 1 described in FIG. 1: A bottom DBR 100 is grown on a lattice defining material 80. An active region 160 is composed of two spacers, 180 and 240, and a quantum well region 200. An intermediate layer 260 of InP-based materials are deposited on top spacer 240. Intermediate layer 260, active region 160 and bottom DBR 100 are lattice matched to the lattice defining material 80. A top DBR 320 is relaxed from the lattice defining material 80.

In contrast with VCSEL 1, VCSEL 4 has a layer 500 formed by depositing GaAs on intermediate layer 260. Layer 500 serves as a cantilever stand for top DBR 320. Layer 500 is formed by selectively etch away the materials under top DBR 320. Top DBR 320 can be considered as a cantilever arm which is separated from the phase-matched portion of the VCSEL 4 by a tunable air gap 480. By applying proper voltage between the top DBR and the active region between electrical contacts 520 and the substrate 80, top DBR 320 can be electrically deformed. Deformation of top DBR 320 results in a change of the cavity mode due to the change of air gap 480. Reader can refer to U.S. Pat. No. 5,629,951 by C. J. Chang-Hasnain et al for detailed description of the structure of such a device. Active region 160, if forward biased can be used in a laser structure, and if reverse biased, can be used in a light detector structure. This device can be either top-emitting or bottom-emitting.

Figure 5:
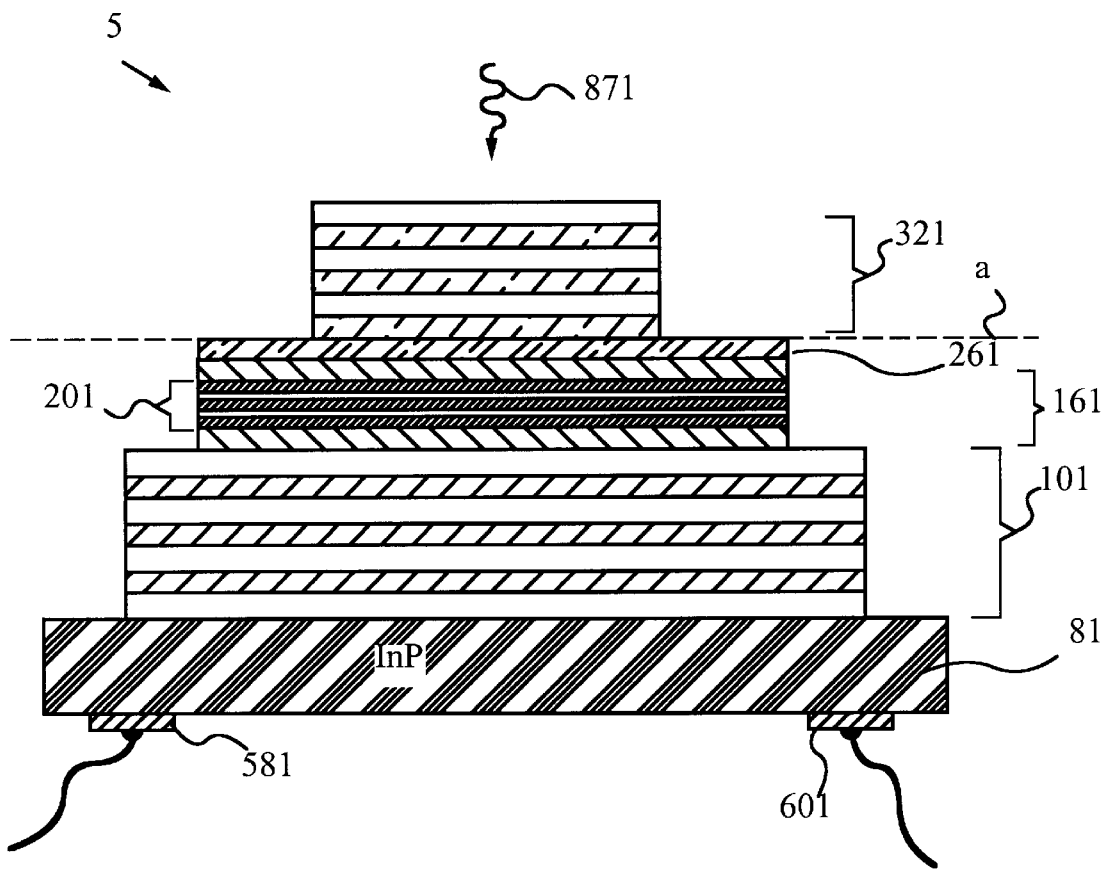
FIG. 5 is a cross sectional view of a VCDET according to the invention.

FIG. 5 illustrates a cross sectional view of a Vertical Cavity Detector (VCDET) 5 according to the invention.

The following components of VCSEL 5 are similar in material composition and specifications to respective components of VCSEL 1 described in FIG. 1: a bottom DBR 101 is lattice matched to the lattice defining material 81. Region 321 is the top DBR which is lattice relaxed from the lattice defining material. Active region 20, intermediate layer 26 and confinement layer 28 in VCSEL 1 are replaced by a intermediate layer 261 and an active region 161. The optical thickness of intermediate layer 261 and active region 161 is decided by the predetermined resonant detection wavelength of VCDET 5. If the wavelength of an incident light 871 is resonant with the vertical cavity formed by the bottom DBR 101 and the top DBR 321, incident light will be absorbed by the device. 581 and 601 are metal contacts used to detect the opto-electrical current generated by absorption of light. Intermediate layer 261 and an active region 161 can also be replaced by a wavelength filter to create a optical filter.

Obvious extensions of the present invention include the construction of arrays of VCSELs and VCDETs which operate at the same or different wavelengths, arrays of wavelength tunable lasers and detectors with different air gap distances, arrays of optical filters, and any other obvious ideas that can be derived from the description.

The novel structure and growth method of lattice relaxed vertical optical cavities increase the reflectivity of top DBR, reduce the absorption and diffraction loss, thus ensure efficient operation for fiber-optic communication applications. Furthermore, the invention reduces the fabrication cost, and enables wafer-size fabrication process.

In view of the above, the scope of the invention should be determined by the following claims and their legal equivalents.

What is claimed is:

1. A vertical optical cavity having:
   a) a lattice-matched portion grown to match a lattice defining material, said lattice-matched portion comprising:
      1) a bottom Distributed Bragg Reflector;
      2) a region grown on top of said bottom Distributed Bragg Reflector; and
   b) a lattice-relaxed portion having a predetermined lattice mismatch factor and comprising a top Distributed Bragg Reflector grown on top of said region.

2. The vertical optical cavity of claim 1 wherein said region comprises an active region, such that said vertical optical cavity is a vertical cavity surface emitting laser.

3. The vertical optical cavity of claim 2 wherein said active region is selected from the group consisting of a Quantum Well and bulk active media.

4. The vertical optical cavity of claim 3 wherein said Quantum Well is selected from the group consisting of compressive strained Quantum Wells, tensile strained Quantum Wells and unstrained Quantum Wells.

5. The vertical optical cavity of claim 2 wherein said Quantum Well has a Quantum Well barrier selected from the group consisting of unstrained Quantum Well barriers and strained Quantum Well barriers.

6. The vertical optical cavity of claim 1 wherein said region comprises an active region which is reversibly biased, such that said vertical optical cavity is a vertical cavity detector.

7. The vertical optical cavity of claim 1 wherein said lattice mismatch factor is as large as 20%.

8. The vertical optical cavity of claim 1 wherein said lattice defining material is InP.

9. The vertical optical cavity of claim 1 wherein said bottom Distributed Bragg Reflector comprises a material selected from the group consisting of InAlGaAs, InGaAsP, AlGaAsSb.

10. The vertical optical cavity of claim 1 wherein said top Distributed Bragg Reflector comprises a material selected from the group consisting of AlGaAs, InGaP and InGaAsP.

11. The vertical optical cavity of claim 1 further comprising an intermediate layer adjacent said region, said intermediate layer being lattice-matched to said lattice defining material.

12. The vertical optical cavity of claim 1 further comprising a current-confining layer deposited on top of said region.

13. The vertical optical cavity of claim 12 wherein said current-confining layer is oxidized and belongs to said lattice-relaxed portion.

14. The vertical optical cavity of claim 12 wherein said current-confining layer is ion-implanted.

15. The vertical optical cavity of claim 1 further comprising a tunable air gap adjacent said active layer.

16. The vertical optical cavity of claim 1 wherein at least a part of said top Distributed Bragg Reflector is oxidized.

17. The vertical optical cavity of claim 1 wherein at least a part of said top Distributed Bragg Reflector is ion-implanted.

18. A method of growing a vertical optical cavity comprising the following steps:
   a) selecting a lattice defining material;
   b) growing a lattice-matched portion comprising:
      1) a bottom Distributed Bragg Reflector;
      2) a region grown on top of said bottom Distributed Bragg Reflector; and
   c) growing on top of said region a lattice-relaxed portion having a predetermined lattice mismatch factor and comprising a top Distributed Bragg Reflector.

19. The method of claim 18 wherein said vertical optical cavity is grown in one step by a first epitaxial growth method.

20. The method of claim 18 wherein said lattice-relaxed portion is grown by a second epitaxial growth method.

21. The method of claim 18 further comprising growing an intermediate layer adjacent said active layer.

22. The method of claim 21 wherein said intermediate layer is oxidized to form a current confining layer.

23. The method of claim 21 wherein said intermediate layer is ion-doped to form a current confining layer.

* * * * *

UNITED STATES PATENT AND TRADEMARK OFFICE
CERTIFICATE OF CORRECTION

PATENT NO. : 5,991,326
DATED : November 23, 1999
INVENTOR(S) : Yuen, et al.

It is certified that error appears in the above-identified patent and that said Letters Patent is hereby corrected as shown below:

On the title page, item [54] and Column 1, title should read
LATTICE-RELAXED VERTICAL OPTICAL CAVITIES item [75] Inventors: Wupen Yuen, Stanford; Gabriel S. Li, Daly City; Constance J. Chang-Hasnain, Union City, all of Calif.

Signed and Sealed this

Fifteenth Day of August, 2000

Attest:

Q. TODD DICKINSON

*Attesting Officer*  *Director of Patents and Trademarks*